US006815801B2

(12) United States Patent
Romas et al.

(10) Patent No.: US 6,815,801 B2
(45) Date of Patent: Nov. 9, 2004

(54) VERTICAL BIPOLAR TRANSISTOR AND A METHOD OF MANUFACTURE THEREFOR INCLUDING TWO EPITAXIAL LAYERS AND A BURIED LAYER

(75) Inventors: Gregory G. Romas, McKinney, TX (US); Darrel C. Oglesby, Jr., Sherman, TX (US); Scott F. Jasper, Sherman, TX (US); Philip Najfus, Sherman, TX (US); Venkatesh Govindaraju, McKinney, TX (US); ChunLiang Yeh, Allen, TX (US); James Lisenby, Sherman, TX (US)

(73) Assignee: Texas Instrument Incorporated, Dallas, TX (US)

( * ) Notice: Subject to any disclaimer, the term of this patent is extended or adjusted under 35 U.S.C. 154(b) by 0 days.

(21) Appl. No.: 10/377,053

(22) Filed: Feb. 28, 2003

(65) Prior Publication Data

US 2004/0169257 A1 Sep. 2, 2004

(51) Int. Cl.[7] .................... H01L 27/082; H01L 27/102; H01L 27/70; H01L 31/11; H01L 21/8222
(52) U.S. Cl. .................... 257/566; 257/585; 257/593; 438/313; 438/339; 438/345; 438/353; 438/357
(58) Field of Search ................. 438/313, 339, 438/345, 353, 357; 257/566, 585, 593, 514, 515

(56) References Cited

U.S. PATENT DOCUMENTS

| 4,005,453 A | * | 1/1977 | Le Can et al. .............. 257/512 |
| 4,910,160 A |   | 3/1990 | Jennings et al. ............... 438/19 |
| 4,939,099 A |   | 7/1990 | Seacrist et al. ............. 438/189 |
| 5,001,073 A |   | 3/1991 | Huie .......................... 438/283 |
| 5,011,784 A |   | 4/1991 | Ratnakumar ................ 438/203 |
| 5,179,432 A |   | 1/1993 | Husher ....................... 257/593 |
| 5,248,624 A |   | 9/1993 | Icel et al. ................... 438/201 |
| 5,302,534 A |   | 4/1994 | Monk et al. ................ 438/234 |
| 5,702,959 A |   | 12/1997 | Hutter et al. ............... 438/201 |
| 5,837,590 A |   | 11/1998 | Latham et al. ............. 438/364 |
| 5,889,315 A |   | 3/1999 | Farrenkopf et al. ......... 257/552 |
| 5,899,714 A |   | 5/1999 | Farrenokopf et al. ....... 438/202 |
| 5,965,930 A | * | 10/1999 | Sakamoto et al. .......... 257/584 |
| 6,222,250 B1 |  | 4/2001 | Gomi ......................... 257/577 |
| 2002/0160562 A1 | * | 10/2002 | Babcock et al. ............ 438/207 |
| 2003/0219952 A1 | * | 11/2003 | Fujimaki .................... 438/322 |

* cited by examiner

Primary Examiner—William M. Brewster
(74) Attorney, Agent, or Firm—Peter K. McLarty; W. James Brady, III; Frederick J. Telecky, Jr.

(57) ABSTRACT

The present invention provides a vertical bipolar transistor 110, a method of manufacture therefor, and an integrated circuit including the same. The vertical bipolar transistor 110 may include, in one embodiment, a second epitaxial layer 140 located over a first epitaxial layer 130, wherein the second epitaxial layer includes at least two dopant profiles 143, 147. The vertical bipolar transistor 110 may further include a collector 154, a base 156 and an emitter 158 located over or within the second epitaxial layer 140.

14 Claims, 11 Drawing Sheets

VERTICAL BIPOLAR TRANSISTOR AND A METHOD OF MANUFACTURE THEREFOR INCLUDING TWO EPITAXIAL LAYERS AND A BURIED LAYER

TECHNICAL FIELD OF THE INVENTION

The present invention is directed, in general, to a semiconductor device and, more specifically, to a vertical bipolar transistor, a method of manufacture thereof, and an integrated circuit including the same.

BACKGROUND OF THE INVENTION

The advent of the integrated circuit has had a significant impact on various types of communication devices. For example, the integrated circuit has been incorporated into both radio frequency applications and high speed communication network systems, as well as many other systems. While the reliability and operation speeds of these communication devices have dramatically increased, those skilled in the art still pay a substantial amount of attention to optimizing such properties.

One device that has garnered specific attention of late, is that of the bipolar transistor, and particularly, the PNP-type bipolar transistor. As those skilled in the art are well aware, PNP-type bipolar transistors have a number of uses. Lately, however, PNP-type bipolar transistors have found substantial use as the output (pass) device in many low dropout regulators. Often, such low dropout regulators are useful in battery applications, such as cell phones.

Initially, lateral PNP-type bipolar transistors were chosen for use as the output (pass) devices. This decision was made at least in part because the manufacture of the lateral PNP-type bipolar transistors fits extremely well into the "typical" standard bipolar transistor process flow. Accordingly, the lateral PNP-type bipolar transistors are easily integrated with various NPN-type bipolar transistors, as well as conventional CMOS transistors.

Unfortunately, however, the lateral PNP-type bipolar transistor suffers from poor packing density, its beta peaking at a low current density due to its base being comprised of an N-type epitaxial (EPI) layer, and poor AC performance due to the typically large base-width requirements. Nonetheless, it is desirable to have a device whose electrical characteristics (magnitude and current density of the peak beta) are not coupled to the N-type EPI layer doping, and whose AC characteristics are not a function of the lithography used in a 2 $\mu$m "standard" bipolar process flow. The lateral PNP-type bipolar transistors, however, are not sufficiently capable of consistently providing such properties.

As a result, the industry has recently turned to vertical PNP-type bipolar transistors for use as the output (pass) devices. While the vertical PNP-type bipolar transistors do not normally experience the aforementioned drawbacks of the lateral PNP-type bipolar transistors, their use generally requires a trade-off in the performance of any NPN-type bipolar transistors located proximate thereto. Furthermore the vertical PNP-type bipolar transistors typically involve exotic diffusion cycles or EPI recipes, using a combination of both P and N-type EPI materials. Any flow which requires both types of EPI would similarly require two sets of EPI equipment and therefore is generally undesirable.

Additionally, problems exist with isolating the collector of the vertical PNP-type bipolar transistors, as well as reducing the collector resistance to as low a value as possible. In many conventional vertical PNP-type bipolar transistor flows, the collector of the device is not truly isolated from the substrate. This often makes the vertical PNP-type bipolar transistor unsuitable for certain applications.

The industry has attempted to correct the aforementioned collector isolation problem. For example, in certain cases where collector isolation is achieved, much of the previous work has been to place an N- diffusion into the starting substrate, drive it in, and then place the buried portion of the vertical PNP-type bipolar transistor's collector (P-type buried collector) directly into this N-type region.

Unfortunately, this process has at least two drawbacks. First, the breakdown voltage of the transistor is greatly reduced because two highly doped junctions are placed together. Second, the N-type diffusion "pinches" the P-type buried collector making it more resistive, and thus reducing its capacities at high current levels. This type of device will normally saturate at relatively low current densities, which as those skilled in the art well understand, is undesirable.

To overcome the aforementioned "pinching" effect, the industry has attempted to increase the doping of the P-type buried collector to a very high level. This has the disadvantage that during subsequent EPI growth cycles the out-gassing and updiffusion of the P-type collector is greatly increased, causing the collector to be shorted to the isolation. In effect, this substantially defeats the purpose of the N-type isolation diffusion.

To overcome the "out-gassing" from the highly doped P-type collector, an N+ "spacing" diffusion may be placed between the vertical PNP-type bipolar transistor's subcollector and the adjacent isolation. A drawback of this approach is that it reduces the operating voltage of the device, increases the size of the transistor, and in some cases requires an additional mask/implant step. Other solutions require the addition of large numbers of "spacing" diffusions to ensure isolation. These, however, also have the effect of growing the size of the transistor.

Accordingly, what is needed in the art is a vertical PNP-type bipolar transistor that does not experience the problems associated with conventional vertical PNP-type bipolar transistors, however, one that can also be easily incorporated into the "typical" standard bipolar transistor process flow.

SUMMARY OF THE INVENTION

To address the above-discussed deficiencies of the prior art, the present invention provides a vertical bipolar transistor, a method of manufacture therefor, and an integrated circuit including the same. The vertical bipolar transistor may include, in one embodiment, a second epitaxial layer located over a first epitaxial layer, wherein the second epitaxial layer includes at least two dopant profiles. The vertical bipolar transistor may further include a collector, a base and an emitter located over or within the second epitaxial layer.

The present invention further includes a method for manufacturing the vertical bipolar transistor disclosed above, as well as an integrated circuit including the vertical bipolar transistor. The integrated circuit, in addition to that disclosed above, may further include an NPN transistor located above the second epitaxial layer and proximate the vertical bipolar transistor, as well as interconnects contacting the vertical bipolar transistor and NPN bipolar transistor to form an operative integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
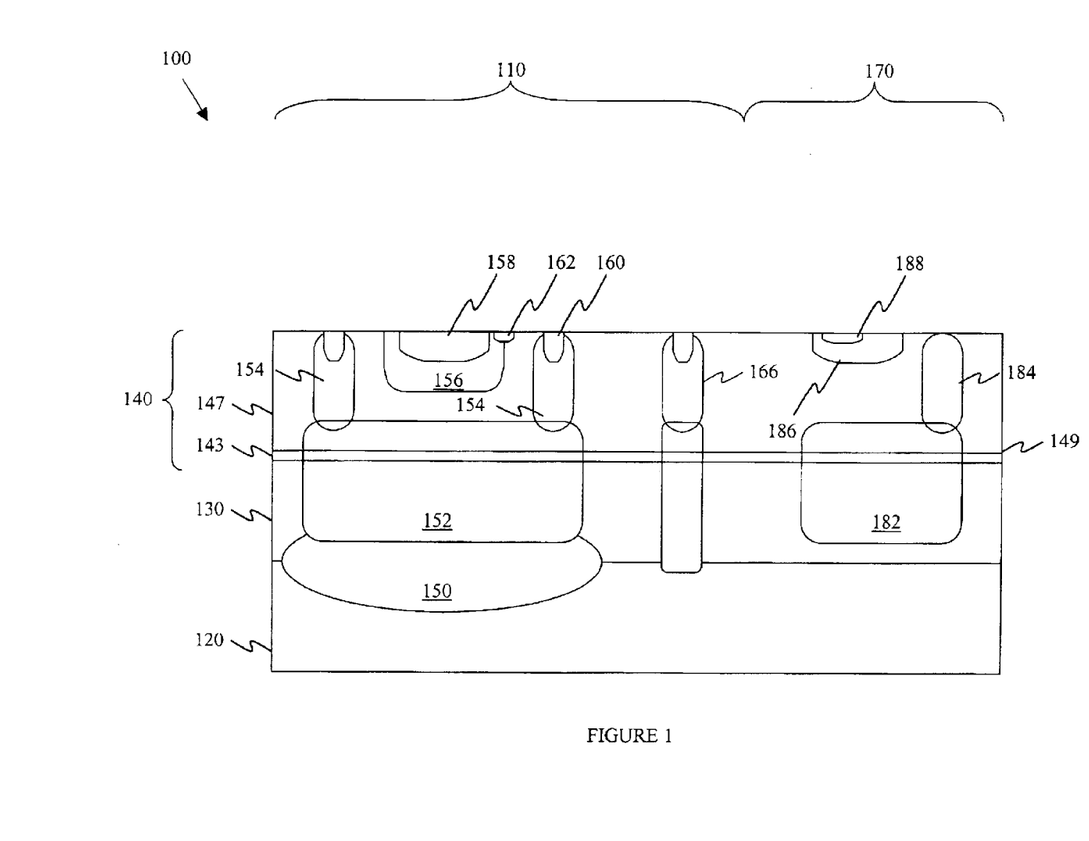
FIG. 1 illustrates a cross-sectional view of one embodiment of a partially completed integrated circuit constructed in accordance with the principles of the present invention.

Referring initially to FIG. 1, illustrated is a cross-sectional view of one embodiment of a partially completed integrated circuit 100 constructed in accordance with the principles of the present invention. The partially completed integrated circuit 100, in the particular embodiment shown, includes a vertical bipolar transistor region 110 and an NPN bipolar transistor region 170, each located over a substrate 120. For purposes of the present invention the vertical bipolar transistor region 110 will be discussed as a vertical PNP bipolar transistor region. Accordingly, each of the layers associated with the vertical bipolar transistor region 110 will be designed for use with the vertical PNP bipolar transistor. It should be understood, however, that the vertical bipolar transistor region 110 could be configured as a vertical NPN bipolar transistor without departing from the scope of the present invention. In such an instance, however, all P-type doped layers should be switched to N-type doped layers, as well as all N-type doped layers should be switched to P-type doped layers.

As shown, the partially completed integrated circuit 100 further includes a first epitaxial layer 130 located over the substrate 120. Further located over the first epitaxial layer 130 is a second epitaxial layer 140. In the current embodiment shown, the second epitaxial layer 140 includes at least two dopant profiles. For example, the second epitaxial layer 140 may include a higher doped second epitaxial layer 143 having a first dopant profile and a lower doped second epitaxial layer 147 having a second dopant profile. In certain embodiments of the present invention, an interface 149 may exist between the first and second dopant profiles of the higher and lower doped second epitaxial layers 143, 147, respectively. In other embodiments, however, the interface 149 does not exist.

The vertical bipolar transistor region 110 illustrated in FIG. 1 further includes an N-well isolation region 150 located within the substrate 120. The vertical bipolar transistor region 110 also includes a P-type buried collector 152 located within the first epitaxial layer 130 and over the N-well isolation region 150. As the first epitaxial layer 130 interposes the P-type buried collector 152 and the N-well isolation region 150, the P-type buried collector 152 is no longer substantially formed within the N-well isolation region 150, as occurs in the prior art devices. Accordingly, the "pinching" effect experienced by the prior art devices may be substantially reduced.

Located over or within the second epitaxial layer 140 in the vertical bipolar transistor region 110 are a collector 154, a base 156 and an emitter 158. Also located within the vertical bipolar transistor region 110 are ohmic contacts 160, 162 for the collector 154 and base 156, respectively, as well as an isolation structure 166.

Additionally, the NPN bipolar transistor region 170 includes an N-type subcollector 182 located within the first epitaxial layer 130. Further, located over or within the second epitaxial layer 140 in the NPN bipolar transistor region 170 are an NPN collector 184, an NPN base 186 and an NPN emitter 188.

The vertical bipolar transistor region 110 illustrated in FIG. 1 does not suffer from many of the shortcomings associated with the prior art devices, especially many of the shortcomings set forth in the background of the invention section discussed above. In contrast to the prior art, the process flow of the embodiment illustrated in FIG. 1 uses a two EPI growth cycle to separate the collector 154 from the N-well isolation region 150, such that there is substantially reduced parasitic pinching, which may cause the collector 154 resistance to be increased. Further in the embodiment shown, the use of two additional mask/implant steps separate the vertical bipolar transistor region 110 from the NPN bipolar transistor region 170 flow. Further, by using the novel multiple dopant profile second epitaxial layer 140, the need for additional spacing diffusions has been removed. Accordingly, the vertical bipolar transistor region 110 of FIG. 1 is more simplified than the prior art.

Additionally, the process flow for the vertical bipolar transistor region 110 allows its size to be kept to a minimum. Also of importance, the manufacture of the vertical bipolar transistor region 110 may be easily incorporated into the "typical" standard bipolar transistor process flow.

Figure 2:
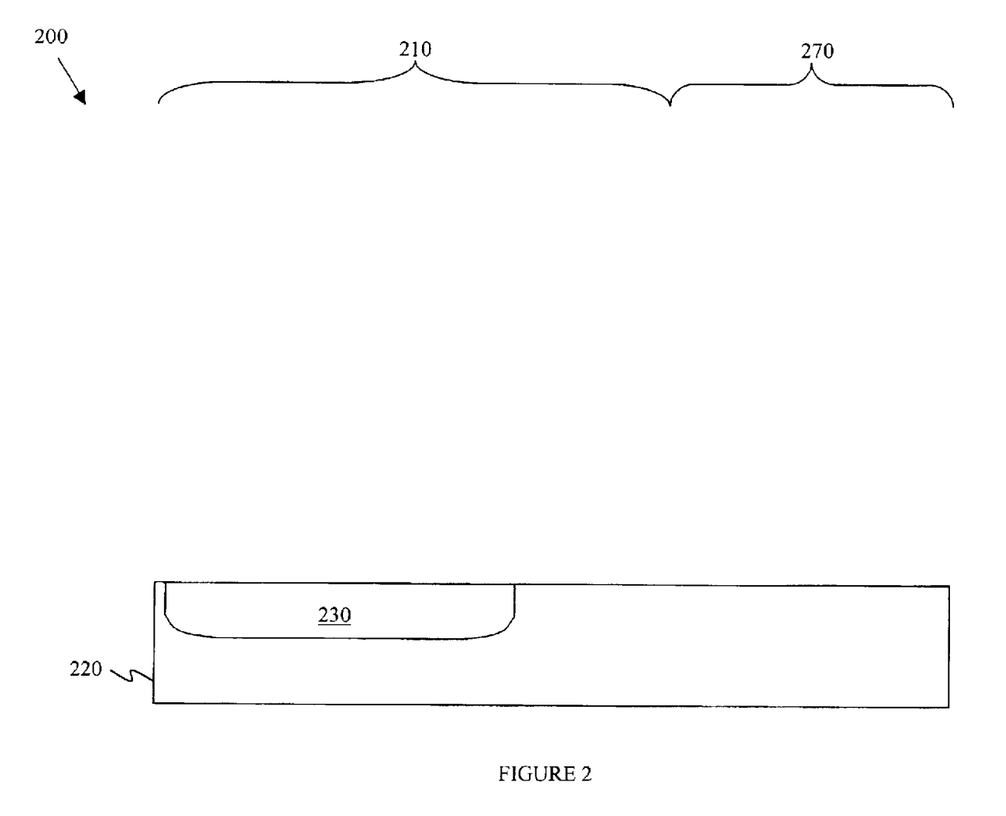
FIG. 2 illustrates a cross-sectional view of a partially completed integrated circuit at an initial stage of manufacture.

Turning to FIGS. 2–6, illustrated are cross-sectional views of detailed manufacturing steps instructing how one might, in an advantageous embodiment, manufacture an integrated circuit in accordance with the method set forth by the principles of the present invention. FIG. 2 illustrates a cross-sectional view of a partially completed integrated circuit 200 at an initial stage of manufacture. The embodiment of the partially completed integrated circuit 200 illustrated in FIG. 2, includes two different types of device regions. For example, the partially completed integrated circuit 200 includes a vertical PNP bipolar transistor device region 210 and an NPN bipolar transistor device region 270 located adjacent thereto. While only two device regions 210, 270 have been shown in FIG. 2, those skilled in the art understand that the integrated circuit 200 extends further to the right and left than shown, and thus, any number of device regions 210, 270 could be used. For ease of discussion, however, only two regions 210, 270 are illustrated and described.

The partially completed integrated circuit 200 illustrated in FIG. 2 further includes a substrate 220, over which the two device regions 210, 270 are located. The substrate 220 may, in an exemplary embodiment, be any layer located in the partially completed integrated circuit 200, including a wafer itself or a layer located above the wafer (e.g., an epitaxial layer). In the embodiment illustrated in FIG. 2 the substrate 220 comprises <111> silicon, however, as stated above various other materials may be used without departing from the scope of the present invention.

Diffused within the substrate 220 in the embodiment of FIG. 2 is an N-well isolation region 230. The N-well isolation region 230, which may be conventionally formed, includes a dopant such as arsenic or antimony. Other N-type dopants are, however, within the scope of the present invention. Further, the N-well isolation region 230 may have a thickness ranging from about 6 $\mu$m to about 13 $\mu$m. In one particular advantageous embodiment, the N-well isolation region 230 has a final thickness of about 11 $\mu$m. Additionally, the N-well isolation region 230, in an exemplary embodiment, has a peak dopant concentration ranging from about 1E16 atoms/cm$^3$ to about 5E17 atoms/cm$^3$. Further, a peak dopant concentration of about 7E16 atoms/cm$^3$ has been found very useful.

Figure 3:
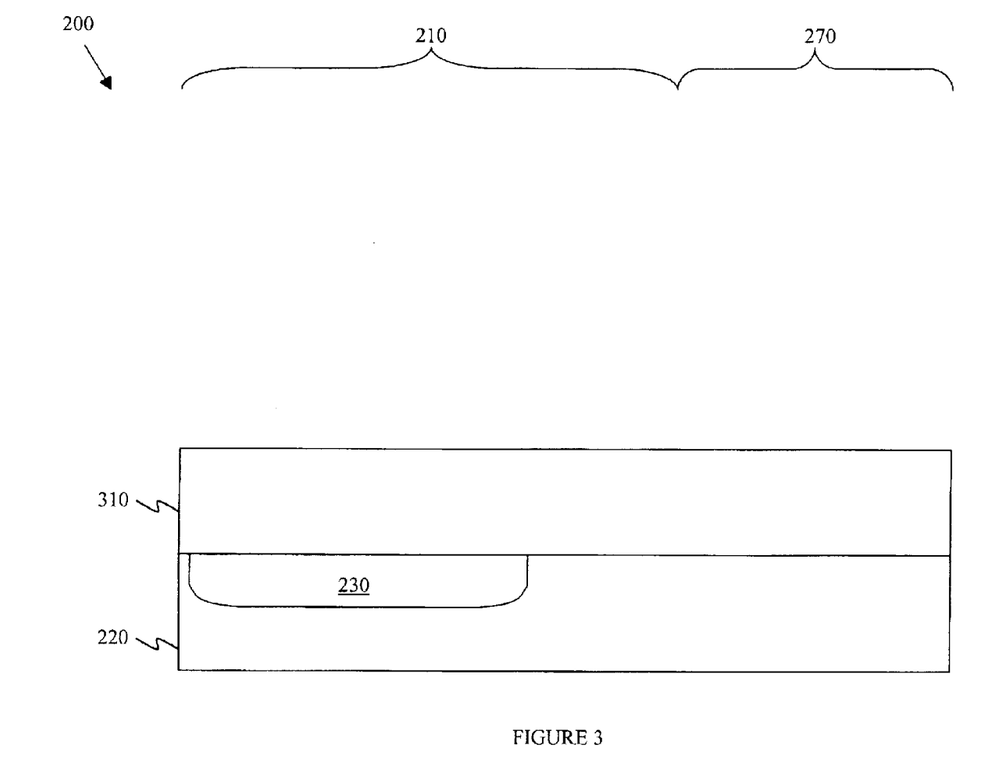
FIG. 3 illustrates a cross-sectional view of the partially completed integrated circuit illustrated in FIG. 2 after formation of a first epitaxial layer over an N-well isolation region.

Turning now to FIG. 3, illustrated is a cross-sectional view of the partially completed integrated circuit 200 illustrated in FIG. 2 after formation of a first epitaxial layer 310 over the N-well isolation region 230. In the particular embodiment shown, the first epitaxial layer 310 is an N-type first epitaxial layer 310. Any N-type dopant, such as antimony, arsenic, or any other known or hereafter discovered N-type dopant, may be used for the first epitaxial layer 310.

The first epitaxial layer 310 has been conventionally formed having a thickness ranging from about 8 $\mu$m to about 12 $\mu$m, with an optimum thickness of about 10 $\mu$m. The first epitaxial layer 310 may further include a peak dopant concentration ranging from about 5E14 atoms/cm$^3$ to about 5E15 atoms/cm$^3$. In one particular advantageous embodiment, a peak dopant concentration of about 1E15 atoms/cm$^3$ may be used. While ranges of thicknesses and dopant concentrations have been given for the first epitaxial layer 310, those skilled in the art understand that the present invention is not constrained by such thicknesses and dopant concentrations.

Figure 4:
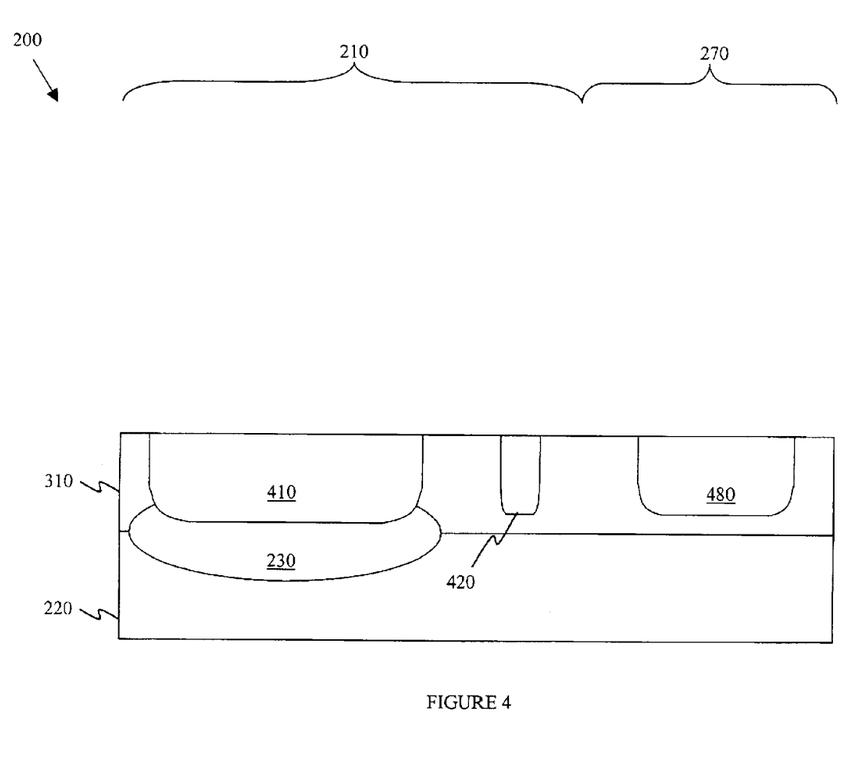
FIG. 4 illustrates a cross-sectional view of the partially completed integrated circuit illustrated in FIG. 3 after implantation/deposition and diffusion of a P-type buried collector and lateral isolation structure within a vertical PNP bipolar transistor region, as well as implantation/deposition and diffusion of an N-type subcollector within an NPN bipolar transistor region.

Turning now to FIG. 4, illustrated is a cross-sectional view of the partially completed integrated circuit 200 illustrated in FIG. 3 after implantation/deposition and diffusion of a P-type buried collector 410 and lateral isolation structure 420 within the lateral PNP bipolar transistor region 210, as well as implantation/deposition and diffusion of an N-type subcollector 480 within the NPN bipolar transistor region 270. In the present embodiment, the P-type buried collector 410 and lateral isolation structure 420 have been conventionally implanted/deposited and diffused. In the particular exemplary embodiment shown, the P-type buried collector 410 and lateral isolation structure 420 have a final thickness ranging from about 8 $\mu$m to about 12 $\mu$m with a preferred final thickness of about 20 $\mu$m. Additionally, the P-type buried collector 410 and lateral isolation structure 420 may have a peak dopant concentration ranging from about 1E18 atoms/cm$^3$ to about 5E18 atoms/cm$^3$, with an exemplary value of about 2E18 atoms/cm$^3$.

Alternatively, the N-type subcollector 480 has been conventionally implanted/deposited and diffused into the first epitaxial layer 310. In the exemplary embodiment shown, the N-type subcollector 480 has a final thickness ranging from about 9.0 $\mu$m to about 11.0 $\mu$m with a preferred final thickness of about 10.3 $\mu$m. Additionally, the N-type subcollector 480 may have a peak dopant concentration ranging from about 8E18 atoms/cm$^3$ to about 3E19 atoms/cm$^3$, with an exemplary value of about 1.5E19 atoms/cm$^3$. While not discussed above, each of the P-type buried collector 410, the lateral isolation structure 420, and the N-type subcollector 480 may have a variety of thicknesses and peak dopant concentrations while staying within the confines of the present invention.

Figure 5:
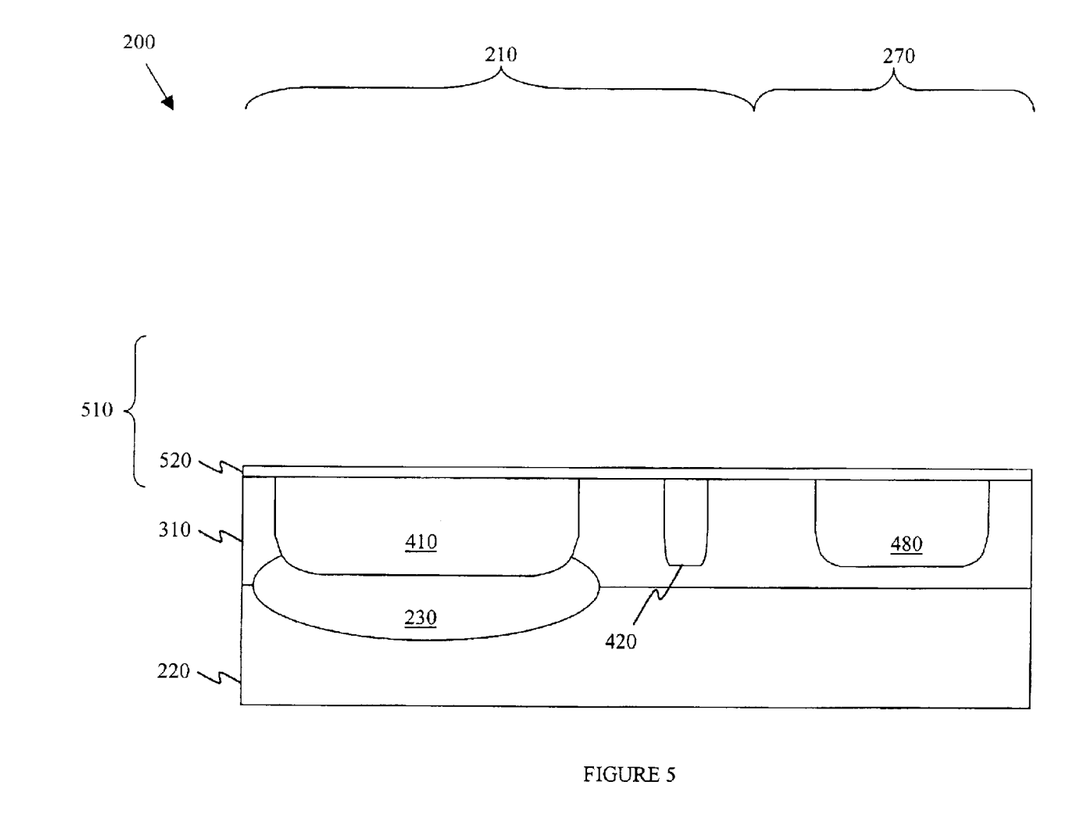
FIG. 5 illustrates a cross-sectional view of the partially completed integrated circuit illustrated in FIG. 4 after initial formation of a second epitaxial layer.

Turning now to FIG. 5, illustrated is a cross-sectional view of the partially completed integrated circuit 200 illustrated in FIG. 4 after initial formation of a second epitaxial layer 510. In the particular embodiment shown, the initial formation of the second epitaxial layer 510 includes the formation of a higher doped second epitaxial layer 520. The higher doped second epitaxial layer 520 may comprise a number of different thicknesses, however, thicknesses ranging from about 0.3 $\mu$m to about 1.5 $\mu$m are generally desired. In one particularly advantageous embodiment, the higher doped second epitaxial layer 520 has an exemplary thickness of about 0.5 $\mu$m.

Many manufacturing techniques may be used to form the higher doped second epitaxial layer 520. For example, in the particular embodiment shown, the higher doped second epitaxial layer 520 has been conventionally grown in the presence of a flow of dopant causing it to have a resistivity ranging from about 1 ohm-cm to about 2 ohm-cm. Additionally, the resulting higher doped second epitaxial layer 520 may have a peak N-type dopant concentration ranging from about 5E15 atoms/cm$^3$ to about 1E16 atoms/cm$^3$, with a preferred value being about 8E15 atoms/cm$^3$. While certain formation techniques have been described for the higher doped second epitaxial layer 520, those skilled in the art understand that any method or process capable of or configured to produce the higher doped second epitaxial layer 520, is within the scope of the present invention.

Figure 6:
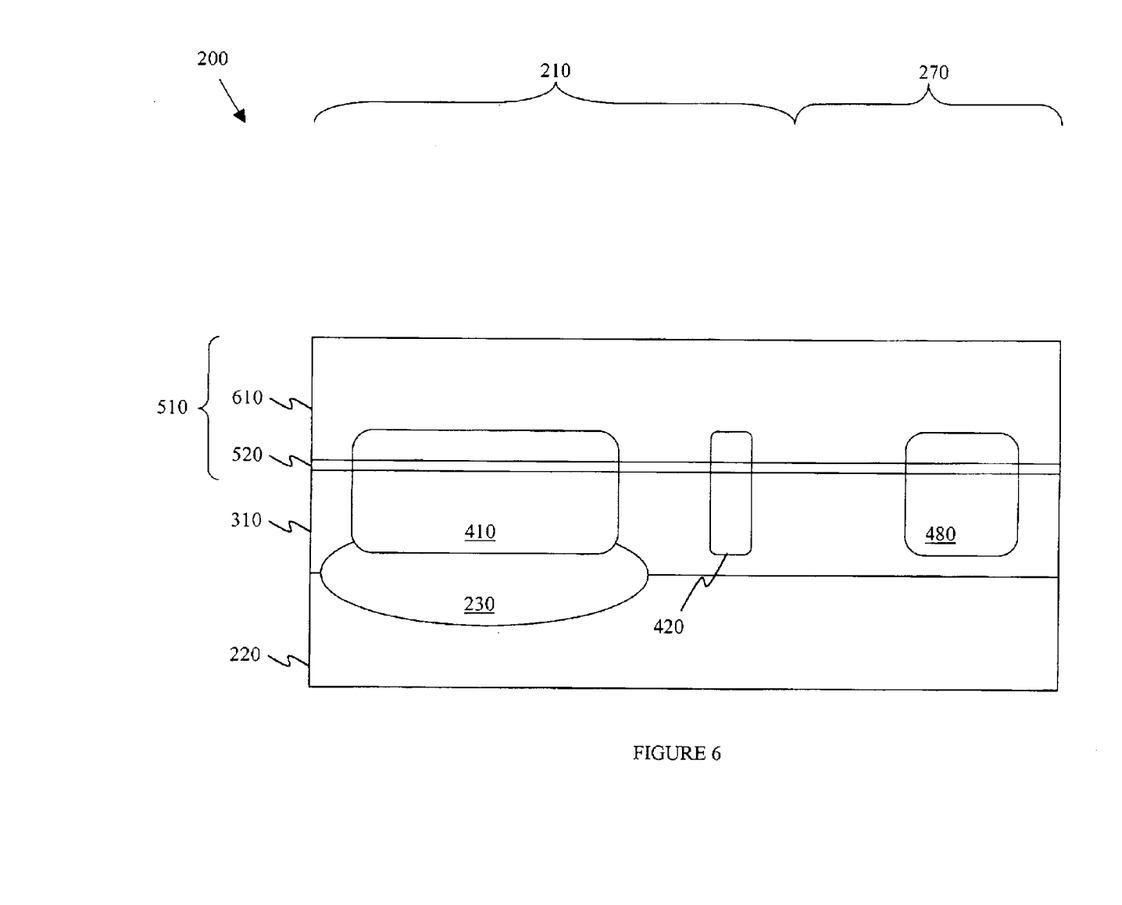
FIG. 6 illustrates a cross-sectional view of the partially completed integrated circuit illustrated in FIG. 5 after completion of the second epitaxial layer.

Turning now to FIG. 6, illustrated is a cross-sectional view of the partially completed integrated circuit 200 illustrated in FIG. 5 after completion of the second epitaxial layer 510. The act of completing the second epitaxial layer 510 includes the step of forming a lower doped second epitaxial layer 610 over the higher doped second epitaxial layer 520. The lower doped second epitaxial layer 610 may comprise a number of different thicknesses, however, a thickness ranging from about 12 µm to about 17 µm, with a preferred thickness of about 15 µm, is generally desired.

Many manufacturing techniques may also be used to form the lower doped second epitaxial layer 610. Most likely, however, the lower doped second epitaxial layer 610 is formed using a similar process as the higher doped second epitaxial layer 520. With the exception that the flow used to form each of the layers 520, 610 is different, the techniques are substantially similar. The different flows result in the layers having different thicknesses (as illustrated above) as well as different dopant concentrations.

Accordingly, one exemplary method for forming the lower doped second epitaxial layer 610 includes forming it in-situ with the higher doped second epitaxial layer 520. Such a situation might include adjusting the dopant flow to achieve a resistivity ranging from about 3 ohm-cm to about 5 ohm-cm after completion of the higher doped second epitaxial layer 520. As those skilled in the art are well aware, this increased dopant flow allows the lower doped second epitaxial layer 610 to be formed having a lower dopant concentration than that of the higher doped second epitaxial layer 520. For example, in the particular embodiment shown, the lower doped second epitaxial layer 520 has a peak N-type dopant concentration ranging from about 1E14 atoms/cm$^3$ to about 5E15 atoms/cm$^3$, with a preferred value being about 1E15 atoms/cm$^3$.

As the higher doped second epitaxial layer 520 was formed with a different flow than the lower doped second epitaxial layer 610, they should have different dopant profiles. Accordingly, the second epitaxial layer 510 as a whole, has at least two different dopant profiles. The term dopant profile as used herein is intended to include the entire profile of dopant concentration with respect to depth, including any tailing off as the dopant goes deeper into the surface of the material. Accordingly, only a sharp change in dopant concentration (whether up or down), and not a consistent tailing off of a dopant concentration, would be considered a different dopant profile.

While the second epitaxial layer 510 of FIG. 6 illustrates that an interface 620 may be located between the higher doped second epitaxial layer 520 and the lower doped second epitaxial layer 610, those skilled in the art understand that such may not always be the case. If manufactured precisely, a physical interface might not exist between the higher doped second epitaxial layer 520 and the lower doped second epitaxial layer 610.

A unique advantage of the novel second epitaxial layer 510, is that the highly doped second epitaxial layer 520 is configured to counter dope the out-gassing effect of the P-type buried collector 410. This, in contrast to the prior art, allows the novel device of the present invention to be void of any N-type spacers. It is understood that this provides time and money savings over many of the prior art structures.

Figure 7:
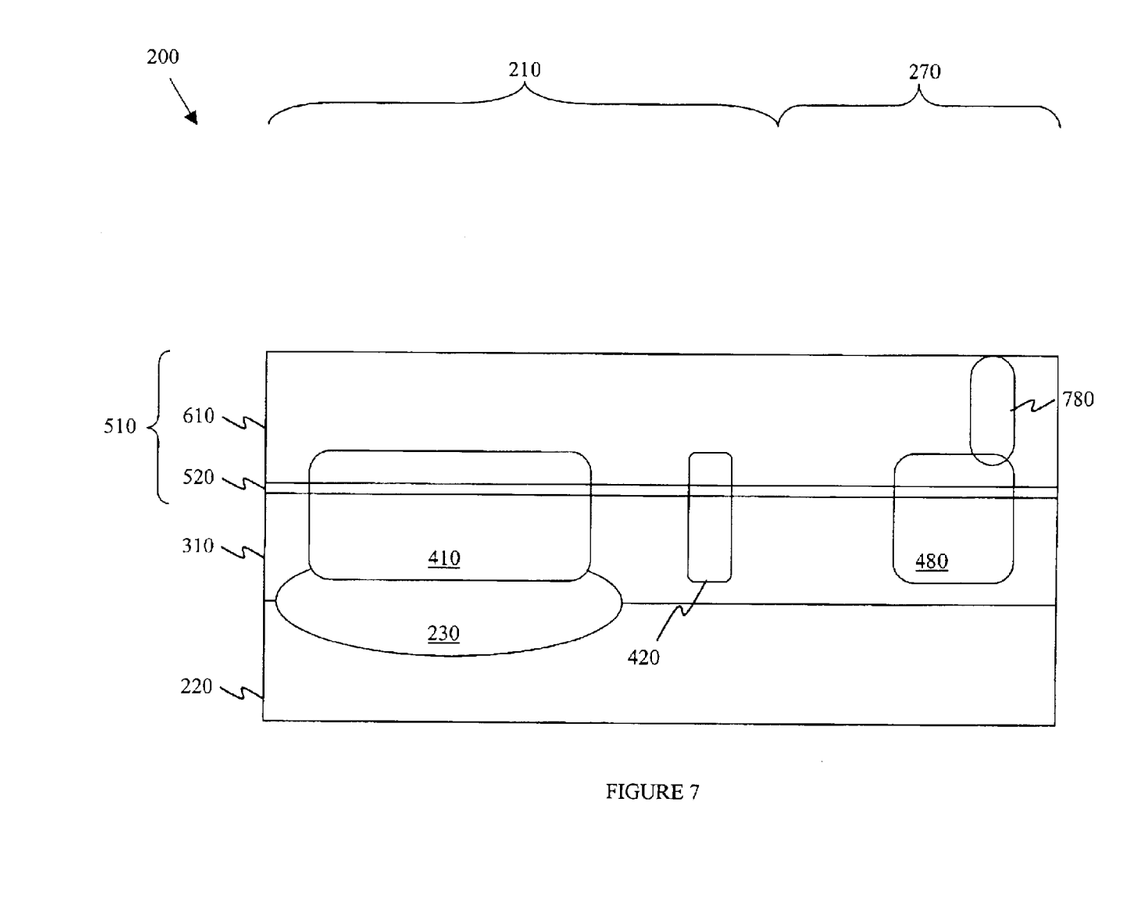
FIG. 7 illustrates a cross-sectional view of the partially completed integrated circuit illustrated in FIG. 6 after formation of an NPN collector within the NPN bipolar transistor region.

Turning now to FIG. 7, illustrated is a cross-sectional view of the partially completed integrated circuit 200 illustrated in FIG. 6 after formation of an NPN collector 780 within the NPN bipolar transistor region 270. Those skilled in the art understand the process that may be used to form the NPN collector 780, including implanting/depositing an N-type dopant within the second epitaxial layer 610. Further included within the process for producing the NPN collector 780 may be a subsequent thermal diffusion drive in step, such that the NPN collector 780 becomes substantially continuous with the N-type subcollector 480.

Figure 8:
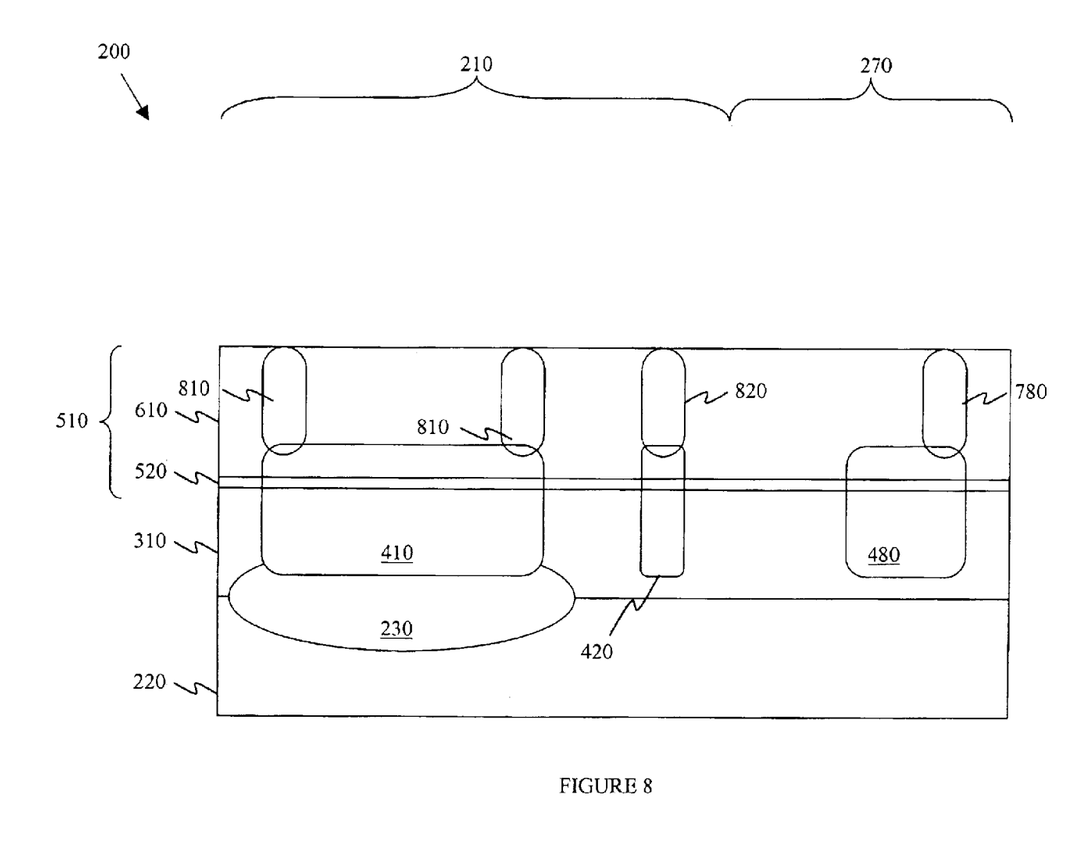
FIG. 8 illustrates a cross-sectional view of the partially completed integrated circuit illustrated in FIG. 7 after formation of vertical PNP collectors and an isolation structure.

Turning now to FIG. 8, illustrated is a cross-sectional view of the partially completed integrated circuit 200 illustrated in FIG. 7 after formation of vertical PNP collectors 810 and an isolation structure 820. Similar to the NPN collector 780, the vertical PNP collectors 810 and the isolation structure 820 may be conventionally formed. In contrast to NPN collector 780, however, the vertical PNP collectors 810 and the isolation structure 820 may comprise a P-type dopant. A thermal diffusion drive in step may also be used in the formation of the vertical PNP collectors 810 and the isolation structure 820. This thermal diffusion drive in step attempts to make the vertical PNP collectors 810 and the isolation structure 820 become substantially continuous with the P-type buried collector 410 and lateral isolation structure 420, respectively. Other conventional processing conditions, including but not limited to dopant concentration, time, temperature, etc., may also be used to form the vertical PNP collectors 810 and the isolation structure 820. As the vertical PNP collectors 810 and the isolation structure 820 comprise similar dopant types, the vertical PNP collectors 810 and the isolation structure 820 may optionally be formed in a single processing step.

Figure 9:
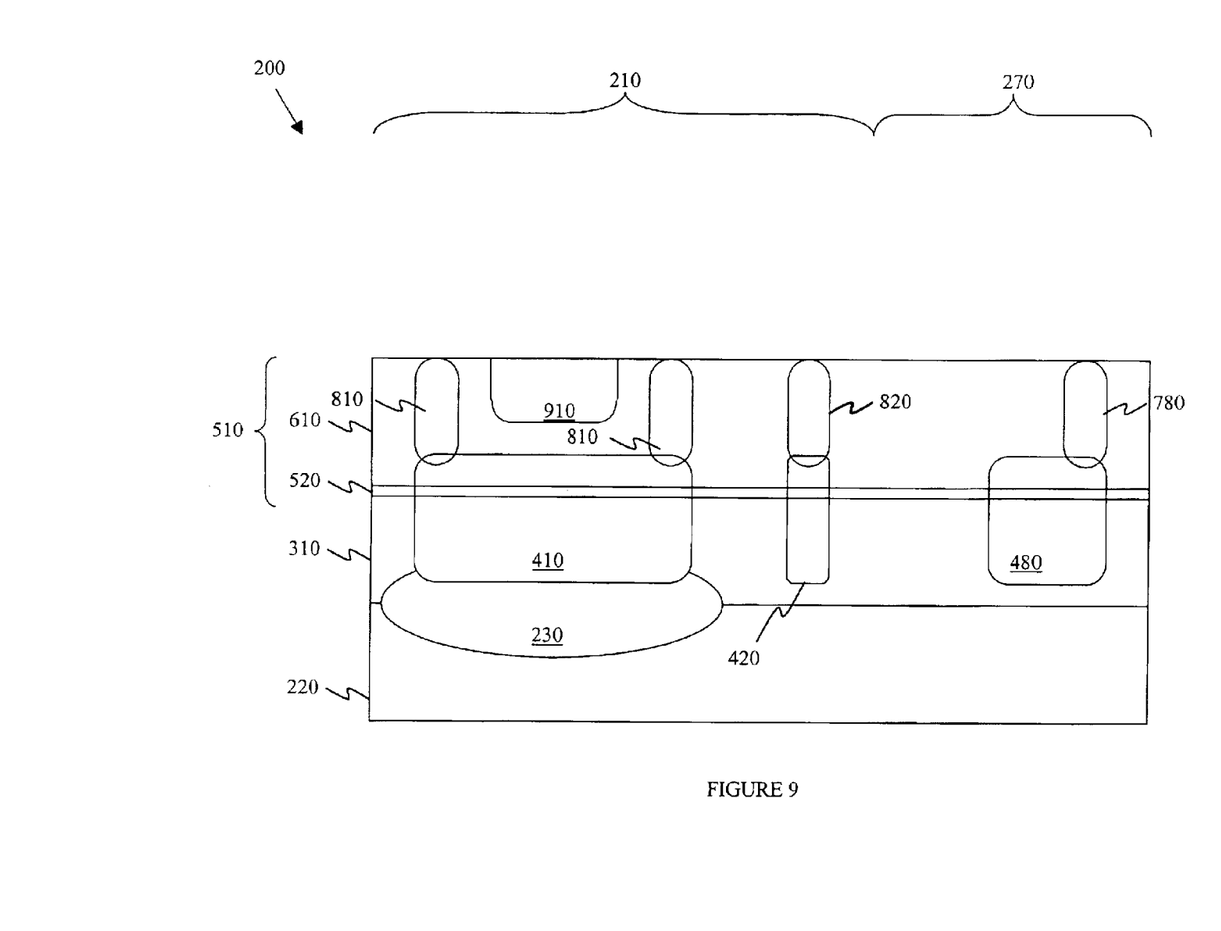
FIG. 9 illustrates a cross-sectional view of the partially completed integrated circuit illustrated in FIG. 8 after formation of a base within the second epitaxial layer and over the P-type buried collector.

Turning now to FIG. 9, illustrated is a cross-sectional view of the partially completed integrated circuit 200 illustrated in FIG. 8 after formation of a base 910 within the second epitaxial layer 610 and over the P-type buried collector 410. Those skilled in the art understand the steps required to form the base 910, including implanting/depositing an N-type dopant, followed by a conventional diffusion step.

Figure 10:
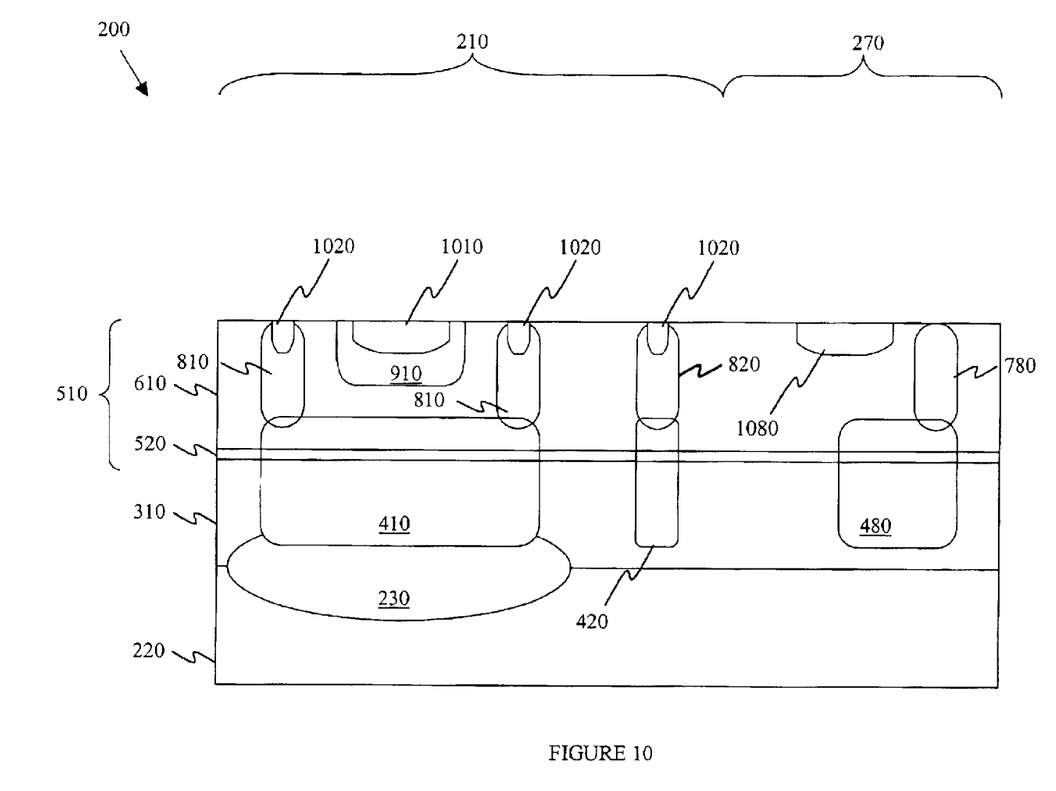
FIG. 10 illustrates a cross-sectional view of the partially completed integrated circuit illustrated in FIG. 9 after formation of an emitter within the base.

Turning now to FIG. 10, illustrated is a cross-sectional view of the partially completed integrated circuit 200 illustrated in FIG. 9 after formation of an emitter 1010 within the base 910. The emitter 1010, which comprises a dopant opposite in type to that of the base 910, generally includes boron or another P-type dopant. Similar to the steps described above, the formation of the emitter 1010 may include both an implant/deposition step, as well as a subsequent thermal diffusion step.

In the illustrative embodiment shown in FIG. 10, formed simultaneous with the emitter 1010 are ohmic contacts 1020 and a base 1080 for the NPN bipolar transistor region 270. While the various regions are shown as formed in a single processing step, those skilled in the art understand that such steps may easily be separated.

It should be noted that the various thermal diffusion steps mentioned above need to be balanced. That is, it is important to balance the thermal cycles in order to get the proper amount of diffusion for each structure. Hence, earlier-created structures should be subjected to less severe thermal cycles than later-created structures (that is if all the other parameters are the same), because the later thermal cycles may substantially affect the extent and concentrations of earlier created structures, as well as possibly the later ones.

After finishing the steps set forth in FIG. 10, the remainder of the partially completed integrated circuit 200 may be conventionally manufactured. Those skilled in the art understand that the steps required to finish manufacturing the partially completed integrated circuit 200 are conventional, and therefore no additional detail is required. Nonetheless, the resulting structure may, in an exemplary embodiment, approximate that shown in FIG. 1.

Figure 11:
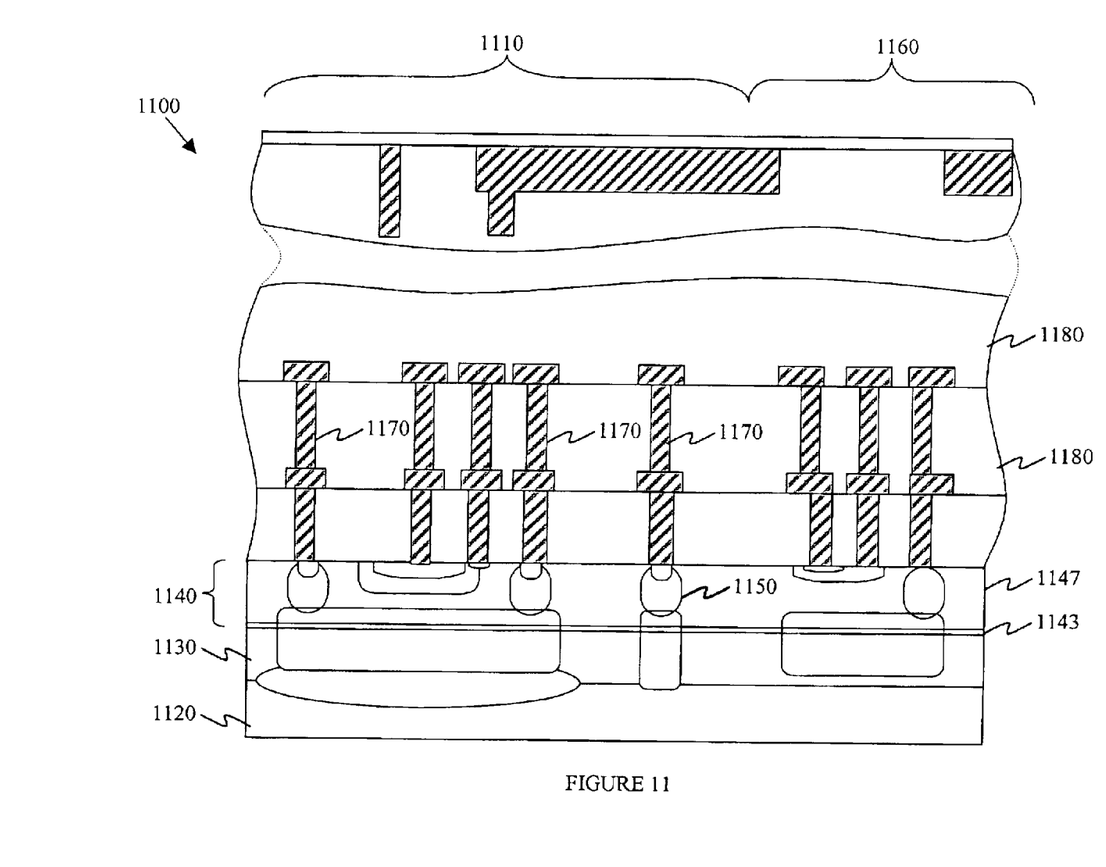
FIG. 11 illustrates a cross-sectional view of an integrated circuit that might be manufactured according to the principles of the present invention.

Turning now to FIG. 11, illustrated is a cross-sectional view of an integrated circuit 1100 that might be manufactured according to the principles of the present invention. The integrated circuit 1100 of FIG. 11 includes a vertical PNP bipolar transistor region 1110 and NPN bipolar transistor region 1160, both of which are located over a substrate 1120. The integrated circuit 1100, as would be expected, includes both a first epitaxial layer 1130 and a second epitaxial layer 1140. Further, the second epitaxial layer 1140 includes a higher doped second epitaxial layer 1143 and a lower doped second epitaxial layer 1147. As shown, an isolation structure 1150 may be positioned to electrically isolate the vertical PNP bipolar transistor region 1110 from the NPN bipolar transistor region 1160. Also shown in FIG. 11 are interconnect structures 1170 located in interlevel dielectric layers 1180, wherein the interconnect structures 1170 connect the vertical PNP bipolar transistor region 1110 and the npn bipolar transistor region 1160 to other areas of the integrated circuit 1100, and thus create an operative integrated circuit.

Although the present invention has been described in detail, those skilled in the art should understand that they can make various changes, substitutions and alterations herein without departing from the spirit and scope of the invention in its broadest form.

What is claimed is:

1. An integrated circuit, comprising:

a first epitaxial layer containing a buried layer;

a second epitaxial layer located over said first epitaxial layer, wherein said second epitaxial layer includes at least two dopant profiles wherein said at least one of said two dopant profiles in contained within said buried layer;

a vertical PNP bipolar transistor located over or within said second epitaxial layer, wherein said vertical PNP bipolar transistor includes a vertical PNP bipolar transistor collector, a vertical PNP bipolar transistor base and a vertical PNP bipolar transistor emitter;

an NPN bipolar transistor located over or within said second epitaxial layer and proximate said vertical PNP bipolar transistor, wherein said NPN bipolar transistor includes an NPN bipolar transistor collector, an NPN bipolar transistor base and an NPN bipolar transistor emitter; and interconnects contacting said vertical PNP bipolar transistor and said NPN bipolar transistor to form an operative integrated circuit.

2. The integrated circuit as recited in claim 1 wherein said at least two dopant profiles of said second epitaxial layer comprise a higher doped second epitaxial layer and a lower doped second epitaxial layer.

3. The integrated circuit as recited in claim 2 wherein said higher doped second epitaxial layer has a peak dopant concentration ranging from about 5E15 atoms/cm$^3$ to about 1E16 atoms/cm$^3$ and said lower doped second epitaxial layer has a peak dopant concentration ranging from about 1E14 atoms/cm$^3$ to about 5E15 atoms/cm$^3$.

4. The integrated circuit as recited in claim 1 further including an additional device selected from the group consisting of:

a lateral PNP bipolar transistor;

a vertical NPN bipolar transistor;

a lateral NPN bipolar transistor;

a CMOS device; and a FET device.

5. A bipolar transistor, comprising:

a first epitaxial layer, a buried layer of a first conductivity type;

a base layer of a second conductivity type on said buried layer of a first conductivity type;

an emitter layer of a first conductivity type contained in said base layer of a second conductivity type;

collector regions of a first conductivity type contiguous with said buried layer of a first conductivity type; and a second epitaxial layer of a second conductivity type partly contained within said buried layer of a first conductivity type;

wherein said first epitaxial layer is partly contained within said buried layer.

6. The bipolar transistor of claim 5 wherein said first conductivity type is p-type and said second conductivity type is n-type.

7. The bipolar transistor of claim 6 wherein said buried layer of a first conductivity type comprises a peak dopant concentration of $1 \times 10^{18}$ atoms/cm$^3$ to $5 \times 10^{18}$ atoms/cm$^3$.

8. The bipolar transistor of claim 7 wherein said second epitaxial layer of a second conductivity type comprises a peak dopant concentration of $5 \times 10^{15}$ atoms/cm$^3$ to $1 \times 10^{16}$ atoms/cm$^3$.

9. The bipolar transistor of claim 8 wherein said second epitaxial layer of a second conductivity type comprises a thickness of 0.3 $\mu$m to 1.5 $\mu$m.

10. A method for forming a bipolar transistor, comprising:

forming a first epitaxial layer, forming a buried layer of a first conductivity type;

forming a base layer of a second conductivity type on said buried layer of a first conductivity type;

forming an emitter layer of a first conductivity type contained in said base layer of a second conductivity type;

forming collector regions of a first conductivity type contiguous with said buried layer of a first conductivity type; and forming a second epitaxial layer of a second conductivity type partly contained within said buried layer of a first conductivity type;

wherein said first epitaxial layer is partly contained within said buried layer.

11. The method for forming the bipolar transistor of claim 10 wherein said first conductivity type is p-type and said second conductivity type is n-type.

12. The method for forming the bipolar transistor of claim 11 wherein said buried layer of a first conductivity type is formed with a peak dopant concentration of $1 \times 10^{18}$ atoms/cm$^3$ to $5 \times 10^{18}$ atoms/cm$^3$.

13. The method for forming the bipolar transistor of claim 12 wherein said second epitaxial layer of a second conductivity type is formed with a peak dopant concentration of $5 \times 10^{15}$ atoms/cm$^3$ to $1 \times 10^{16}$ atoms/cm$^3$.

14. The method of forming the bipolar transistor of claim 13 wherein said second epitaxial layer of a second conductivity type is formed to a thickness of 0.3 $\mu$m to 1.5 $\mu$m.

* * * * *